United States Patent
Xu (10) Patent No.: US 12,495,618 B2
(45) Date of Patent: Dec. 9, 2025

(54) ELECTRO-STATIC PROTECTION STRUCTURE, SILICON CONTROLLED RECTIFIER AND SEMICONDUCTOR MEMORY

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 417 days.

(21) Appl. No.: 18/162,703

(22) Filed: Jan. 31, 2023

(65) Prior Publication Data

US 2023/0402450 A1 Dec. 14, 2023

Related U.S. Application Data

(63) Continuation of application No. PCT/CN2022/116189, filed on Aug. 31, 2022.

(30) Foreign Application Priority Data

Jun. 8, 2022 (CN) .......................... 202210645244.X (51) Int. Cl.
*H01L 23/60* (2006.01)
*H10D 89/60* (2025.01)

(52) U.S. Cl.
CPC ......... *H10D 89/931* (2025.01); *H10D 89/713* (2025.01)

(58) Field of Classification Search
CPC ... H10D 89/931; H10D 89/713; H10D 89/811
See application file for complete search history.

(56) References Cited

U.S. PATENT DOCUMENTS

| | | | | |
|---|---|---|---|---|
| 6,304,127 | B1 * | 10/2001 | Lin | ....................... H10D 89/713 361/111 |
| 2008/0198519 | A1 * | 8/2008 | Lim | ....................... H10D 89/713 257/360 |
| 2011/0016440 | A1 * | 1/2011 | Bergmann | ........... H10D 89/601 716/106 |
| 2014/0203367 | A1 * | 7/2014 | Chen | .................... H10D 89/611 257/355 |
| 2014/0327048 | A1 | 11/2014 | Chow et al. | |
| 2016/0372459 | A1 | 12/2016 | Chow et al. | |

FOREIGN PATENT DOCUMENTS

| | | |
|---|---|---|
| CN | 201536104 U | 7/2010 |
| CN | 104103635 A | 10/2014 |
| CN | 104241277 A1 * | 12/2014 |
| CN | 106876388 A1 * | 6/2017 |
| CN | 109599387 A | 4/2019 |
| CN | 112420688 A | 2/2021 |
| CN | 113097206 A | 7/2021 |

* cited by examiner

*Primary Examiner* — Samuel Park
(74) *Attorney, Agent, or Firm* — Syncoda (57) ABSTRACT

An electro-static protection structure includes a substrate, a transistor formed in the substrate, and a capacitor. A first pole of the transistor is connected with an electro-static terminal, and a second pole of the transistor and a gate electrode of the transistor are connected with a discharge terminal. A first pole of the capacitor is connected with the substrate, and a second pole of the capacitor is connected with the electro-static terminal.

17 Claims, 6 Drawing Sheets

ELECTRO-STATIC PROTECTION STRUCTURE, SILICON CONTROLLED RECTIFIER AND SEMICONDUCTOR MEMORY

CROSS-REFERENCE TO RELATED APPLICATIONS

This is a continuation of International Patent Application No. PCT/CN2022/116189 filed on Aug. 31, 2022, which claims priority to Chinese Patent Application No. 202210645244.X filed on Jun. 8, 2022. The disclosures of the above-referenced applications are hereby incorporated by reference in their entirety.

BACKGROUND

Different levels of Electro-Static Discharge (ESD) occur during the manufacturing process of integrated circuit chips and in final system applications. The ESD is a transient process in which a large amount of charge is poured into an integrated circuit from the outside to the inside, and when the integrated circuit is discharged, a high voltage with hundreds or even thousands of volts will be generated, which easily causes damage to a chip.

At present, the semiconductor processing is more and more advanced, channels are shorter, a junction depth is smaller and smaller, oxide layers are thinner and thinner, windows of ESD protection design are smaller and smaller, and the ESD protection design is facing more and more challenges.

SUMMARY

The disclosure relates to the technical field of electro-static protection, and more particularly, to an electro-static protection structure, a Silicon Controlled Rectifier (SCR) and a semiconductor memory.

Embodiments of the disclosure provide an electro-static protection structure, an SCR and a semiconductor memory.

In a first aspect, embodiments of the disclosure provide an electro-static protection structure, which may include: a substrate, a transistor and a capacitor.

The transistor is formed in the substrate, a first pole of the transistor being connected with an electro-static terminal, and a second pole of the transistor and a gate electrode of the transistor being both connected with a discharge terminal.

A first pole of the capacitor is connected with the substrate, and a second pole of the capacitor is connected with the electro-static terminal.

In a second aspect, embodiments of the disclosure provide an SCR, which may include the electro-static protection structure as described in the first aspect.

In a third aspect, embodiments of the disclosure provide a semiconductor memory, which may include the electro-static protection structure as described in the first aspect.

DETAILED DESCRIPTION

The technical solutions in the embodiments of the disclosure will now be described clearly and completely hereinafter with reference to the accompanying drawings in the embodiments of the disclosure. It will be appreciated that the specific embodiments described herein are merely illustrative of the related invention and are not intended to limit the disclosure. In addition, it is also to be noted that, for the convenience of description, parts only related to the related disclosure are illustrated in the drawings.

Unless otherwise defined, all the technical and scientific terms used herein have the same meanings usually understood by those skilled in the art of the disclosure. The terms used herein are for the purpose of describing the embodiments of the disclosure only and are not intended to be limiting of the disclosure.

"Some embodiments" involved in the following descriptions describes a subset of all possible embodiments. However, it will be appreciated that "some embodiments" may be the same subset or different subsets of all the possible embodiments, and may be combined without conflicts.

It is to be noted that the term "first/second/third" involved in the embodiments of the disclosure is only for distinguishing similar objects and does not represent a specific sequence of the objects. It will be appreciated that "first/second/third" may be interchanged to specific sequences or orders if allowed to implement the embodiments of the disclosure described herein in sequences except the illustrated or described ones.

Figure 1:
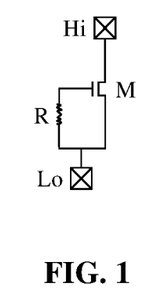
FIG. 1 is a schematic diagram of a circuit structure of a Gate Ground NMOS (GGNMOS) electro-static protection structure.
Figure 2:
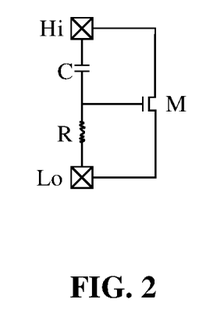
FIG. 2 is a schematic diagram of a circuit structure of a Gate Coupled NMOS (GCNMOS) electro-static protection structure.
Figure 3:
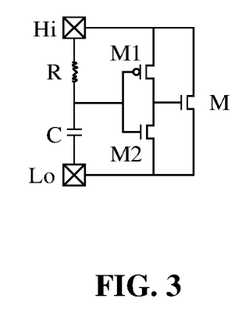
FIG. 3 is a schematic diagram of a circuit structure of an inverted NMOS electro-static protection structure.

In order to protect a semiconductor memory from being endangered by ESD, the semiconductor memory needs to be subjected to ESD protection, and an NMOS transistor is one of the means for ESD protection of the semiconductor memory. For example, FIG. 1 is a schematic diagram of a circuit structure of a GGNMOS electro-static protection structure. FIG. 2 is a schematic diagram of a circuit structure of a GCNMOS electro-static protection structure. FIG. 3 is a schematic diagram of a circuit structure of an inverted NMOS electro-static protection structure.

It is to be noted that in FIGS. 1, 2 and 3, Hi represents an electro-static terminal, Lo represents a discharge terminal, R represents a resistor, C represents a capacitor, M and M2 each represent an NMOS transistor, and M1 represents a PMOS transistor. In the GGNMOS electro-static protection structure illustrated in FIG. 1, a gate electrode of the NMOS transistor M is connected with the discharge terminal Lo through the resistor R, a drain electrode of the NMOS transistor M is connected with the electro-static terminal Hi, and a source electrode of the NMOS transistor M is connected with the discharge terminal Lo. The GGNMOS electro-static protection structure mainly uses a parasitic lateral NPN triode in a circuit to discharge an ESD current.

In the GCNMOS electro-static protection structure illustrated in FIG. 2, the gate electrode of the NMOS transistor M is connected with the discharge terminal Lo through the resistor R, the gate electrode of the NMOS transistor M is also connected with one end of the capacitor C, the other end of the capacitor C is connected with the electro-static terminal Hi, and the drain electrode and the source electrode of the NMOS transistor are respectively connected with the electro-static terminal Hi and the discharge terminal Lo. The GCNMOS electro-static protection structure increases a gate voltage through the coupling of the resistor R and the capacitor C. Under an ESD current, a channel is firstly opened to replace the breakdown of a drain-substrate junction of an MOS structure to generate a conduction current, and finally the ESD current is discharged.

FIG. 3 is an electro-static protection structure of a Resistor-Capacitor (RC)+inverted NMOS. An inverter is composed of an NMOS transistor M2 and a PMOS transistor M1. A gate electrode of the NMOS transistor M2 and the gate electrode of the PMOS transistor are connected together as an input terminal of the inverter. The gate electrode of the NMOS transistor M2 and the gate electrode of the PMOS transistor are connected with the discharge terminal Lo through the capacitor C and to the electro-static terminal Hi through the resistor R. A source electrode of the PMOS transistor M1 and the drain electrode of the NMOS transistor M are both connected with the electro-static terminal Hi. A source electrode of the NMOS transistor M2 and the source electrode of the NMOS transistor M are both connected with the discharge terminal Lo. A drain electrode of the PMOS transistor M1 is connected with a drain electrode of the NMOS transistor M2 as the output terminal of the inverter, which is connected with the gate electrode of the NMOS transistor M. The electro-static protection structure uses the output of the inverter as a gate electrode signal of the NMOS transistor M through the coupling of the capacitor C and the resistor R, and finally discharges the ESD current.

It will be appreciated that as the semiconductor processing is more and more advanced, channels are shorter and shorter, a junction depth is smaller and smaller, oxide layers are thinner and thinner, windows of ESD protection design are smaller and smaller, and the ESD protection design is facing more and more challenges.

Embodiments of the disclosure provide an electro-static protection structure. The electro-static protection structure includes a substrate, a transistor formed in the substrate, and a capacitor. A first pole of the transistor is connected with an electro-static terminal, and a second pole of the transistor and a gate electrode of the transistor are connected with a discharge terminal. A first pole of the capacitor is connected with the substrate, and a second pole of the capacitor is connected with the electro-static terminal. In this way, when ESD occurs, an avalanche breakdown occurs between the transistor and the substrate to generate current into the substrate, and a coupling current will also be generated into the substrate at the capacitor, so that the potential of the substrate changes in a larger amplitude and a faster speed. Thus, a parasitic BJT in the electro-static protection structure can be quickly turned on to discharge an ESD current, so as to play a good electro-static protection function and avoid damaging the device.

The various embodiments of the disclosure will be described in detail below with reference to the accompanying drawings.

Figure 4:
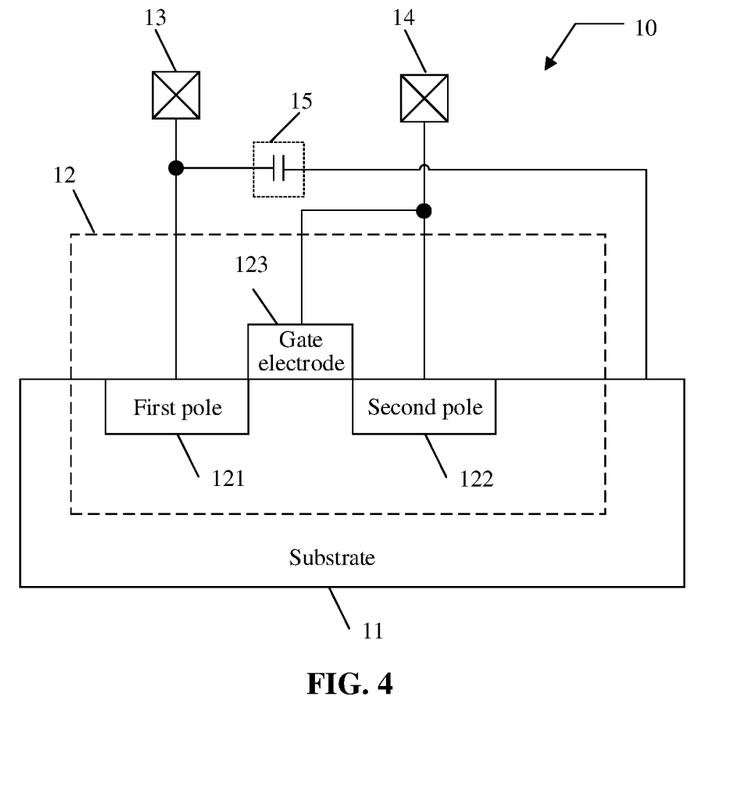
FIG. 4 is a first schematic diagram of a composition structure of an electro-static protection structure according to an embodiment of the disclosure.

In an embodiment of the disclosure, FIG. 4 illustrates a schematic diagram of a composition structure of an electro-static protection structure 10 according to an embodiment of the disclosure. As illustrated in FIG. 1, the electro-static protection structure 10 may include: a substrate 11, a transistor 12 and a capacitor 15.

The transistor 12 is formed in the substrate 11, a first pole 121 of the transistor 12 being connected with an electro-static terminal 13, and a second pole 122 and a gate electrode 123 of the transistor 12 being both connected with a discharge terminal 14.

A first pole of the capacitor 15 is connected with the substrate 11, and a second pole of the capacitor 15 is connected with the electro-static terminal 13.

It is to be noted that the electro-static protection structure 10 provided by the embodiments of the disclosure may be applied to a device such as a semiconductor memory to protect the device from damage when ESD occurs.

FIG. 4 illustrates a schematic cross-sectional view of an electro-static protection structure 10. The electro-static protection structure 10 may include a substrate 11, a transistor 12 formed in the substrate 11, and a capacitor 15 connected between the substrate 11 and the electro-static terminal 13. The electro-static terminal 13, also referred to as a PAD terminal, is a port for charge accumulation. When a large amount of charge is accumulated at the electro-static terminal 13, an ESD phenomenon may occur, resulting in device damage. The discharge terminal 14 is a ground terminal VSS or a power voltage terminal VDD, and a large amount of charge accumulated at the electro-static terminal 13 may be discharged to the discharge terminal 14 through the electro-static protection structure 10, so as to protect the device when ESD occurs.

It is also to be noted that a parasitic bipolar junction transistor (referred to as a parasitic BJT for short) (not illustrated in FIG. 4) is formed in the substrate 11. An emitter and collector of the parasitic BJT are respectively connected with the first pole 121 and the second pole 122 of the transistor 12. In the electro-static protection, the parasitic BJT is triggered to be turned on by the substrate, so that the ESD current is discharged to achieve the effect of protecting the device. Specifically, when a large amount of charge is accumulated at the electro-static terminal 13 to generate ESD, an avalanche breakdown occurs between the transistor 12 and the substrate 11, and current is generated into the substrate 11, so that the substrate potential changes. Meanwhile, due to charge accumulation, the voltage of the electro-static terminal changes, i.e. the voltage loaded at the capacitor 15 changes, so that a coupling current will be generated at the capacitor 15, and the coupling current will also enter the substrate 11. The coupling current and the current generated by the avalanche breakdown work together, so that the potential of the substrate changes in a larger amplitude and a faster speed. Thus the parasitic BJT may be quickly turned on, and then the ESD current is discharged to the discharge terminal 14 through the parasitic BJT, so as to achieve a good electro-static protection effect. Compared with conventional electro-static protection structures such as GGNMOS, the electro-static protection structure 10 provided by the embodiments of the disclosure can turn on the parasitic BJT faster, thereby discharging the ESD current faster, avoiding the harm of poor electro-static protection effect and even damage to the device due to the inability of the parasitic BJT to turn on in time.

Figure 5:
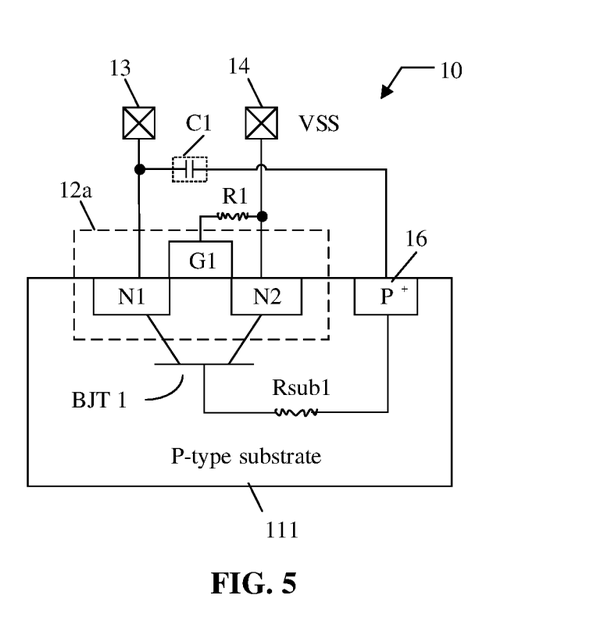
FIG. 5 is a second schematic diagram of a composition structure of an electro-static protection structure according to an embodiment of the disclosure.

In a specific embodiment, as illustrated in FIG. 5, the substrate may be a P-type substrate (which may be represented by Psub) 111, the transistor may include an NMOS transistor 12a, and a first pole and a second pole of the NMOS transistor 12a are respectively a first N-type doped area N1 and a second N-type doped area N2 formed in the P-type substrate 111.

The capacitor may include a first capacitor C1. A first pole of the first capacitor C1 is connected with the P-type substrate 111, and a second pole of the first capacitor C1 is connected with the electro-static terminal 13.

It is also to be noted that in the embodiments of the disclosure, as illustrated in FIG. 5, the transistor may specifically be an NMOS transistor 12a, a first pole of the NMOS transistor 12a is a first N-type doped area N1, and a second pole of the NMOS transistor 12a is a second N-type doped area N2. The first N-type doped area N1 and the second N-type doped area N2 may be both heavily doped or both moderately doped, etc. and may be specifically set in combination with practical application scenarios. This is not specifically limited herein.

The first N-type doped area N1 may form a drain electrode of the NMOS transistor 12a, and the second N-type doped area N2 may form a source electrode of the NMOS transistor 12a.

As illustrated in FIG. 5, in some embodiments, the discharge terminal 14 is a ground terminal VSS, the P-type substrate 111 is connected with the ground terminal VSS, and a P+ doped area 16 is further formed in the P-type substrate 111. The second N-type doped area N2 is located between the first N-type doped area N1 and the P+ doped area 16. The first pole of the first capacitor C1 is connected with the P-type substrate 111 through the P+ doped area 16.

Figure 6:
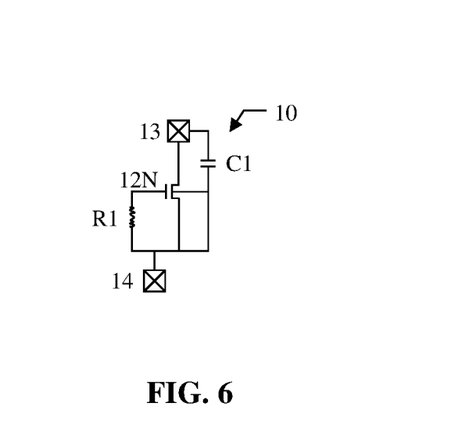
FIG. 6 is a schematic diagram of a circuit structure of an electro-static protection structure according to an embodiment of the disclosure.

It is to be noted that FIG. 6 illustrates a schematic diagram of a circuit structure of an electro-static protection structure 10 according to an embodiment of the disclosure, corresponding to the electro-static protection structure 10 illustrated in FIG. 5. The electro-static protection structure 10 illustrated in FIG. 5 (FIG. 6) serves to discharge a large amount of positive charge accumulated at the electro-static terminal 13 when ESD occurs, so as to protect the device from the ESD. In this case, the discharge terminal 14 is a ground terminal (VSS), and the P-type substrate 111 is a ground connection.

It is also to be noted that in the embodiments of the disclosure, the P+ doped area 16 is heavily doped, so that ohmic contact can be ensured, and parasitic resistance can be reduced, thereby reducing voltage drop. The P-type substrate 111 may be grounded in such a manner that: the P-type substrate 111 is connected with the ground terminal VSS through the P+ doped area 16, or the P-type substrate 111 is directly connected with the ground terminal VSS. This is not specifically limited herein.

It is also to be noted that the first pole of the first capacitor C1 is connected with the electro-static terminal 13, and the second pole of the first capacitor C1 is connected with the P+ doped area 16. That is, the first capacitor C1 may be connected with the P-type substrate 111 through the P+ doped area 16.

As illustrated in FIG. 5, a parasitic BJT 1 is formed in the P-type substrate 111, and the parasitic BJT 1 is of an NPN-type. An emitter of the parasitic BJT 1 is connected with the drain electrode of the NMOS transistor 12a, a collector of the parasitic BJT is connected with the source electrode of the NMOS transistor 12a, and Rsub1 represents an equivalent resistor of the P-type substrate 111. When a large amount of positive charge is accumulated at the electro-static terminal 13 and the potential of the P-type substrate 111 is raised sufficiently to turn on the NPN-type parasitic BJT 1, the parasitic BJT 1 is turned on, so that an ESD current generated by the large amount of positive charge accumulated at the electro-static terminal 13 can be discharged to the ground terminal VSS through the parasitic BJT 1.

Specifically, FIG. 5 illustrates a GGNMOS electro-static protection structure that is mainly used for discharging the large amount of positive charge accumulated at the electro-static terminal 13. When ESD occurs, after the parasitic BJT 1 is turned on, an ESD current generated at the electro-static terminal 13 enters the first N-type doped area N1, flows through the parasitic BJT 1 to the second N-type doped area N2, and is discharged to the ground terminal VSS.

It is also to be noted that in the embodiments of the disclosure, voltage arriving at the electro-static terminal 13 when the parasitic BJT 1 is turned on is recorded as a trigger voltage of the parasitic BJT 1. As illustrated in FIG. 5, since the first capacitor C1 is connected between the electro-static terminal 13 and the P+ doped area 16, when ESD occurs due to the accumulation of positive charge in the electro-static terminal 13, on the one hand, an avalanche breakdown occurs between the drain electrode of the NMOS transistor 12a and the P-type substrate 111 to generate electrons and holes, and the holes enter the P-type substrate 111, so that the potential of the P-type substrate 111 is raised, and on the other hand, due to the voltage change at the electro-static terminal 13, a coupling current is also generated at the first capacitor C1 into the P-type substrate 111. Under the combined action of the holes and the coupling current of the first capacitor C1, the potential of the P-type substrate 111 will be raised higher and faster. In this way, the trigger voltage of the parasitic BJT 1 can be reduced, so that the parasitic BJT 1 can be turned on faster to discharge the ESD current, thereby achieving a better discharge effect and better protecting the device.

Further, in some embodiments, as illustrated in FIG. 5, the electro-static protection structure 10 may further include a resistor R1. The resistor R1 is connected in series between a gate electrode G1 of the NMOS transistor 12a and the discharge terminal 14.

It is to be noted that a resistor R1 is also connected in series between the gate electrode G1 of the NMOS transistor 12a and the discharge terminal 14. The resistor R1 may also act as a gate electrode coupling to facilitate triggering of the parasitic BJT 1 when ESD occurs.

Figure 7:
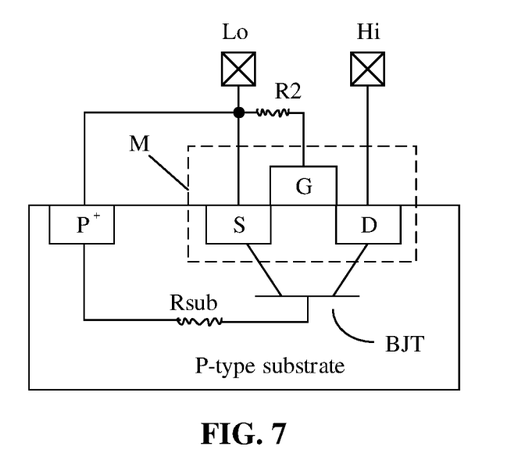
FIG. 7 is a third schematic diagram of a composition structure of an electro-static protection structure according to an embodiment of the disclosure.

For comparison, FIG. 7 is a schematic diagram of a composition structure corresponding to the electro-static protection structure of FIG. 1. As illustrated in FIG. 7, in the GGNMOS electro-static protection structure, the substrate is a P-type substrate, a gate electrode G, source electrode S and P+ doped area ($P^+$ in FIG. 7) of the NMOS transistor M are all connected with the discharge terminal Lo. A drain electrode D of the NMOS transistor M is connected with the ESD terminal Hi, a NPN-type parasitic BJT is formed in the P-type substrate, a collector and emitter of the parasitic BJT are respectively connected with the source electrode S and drain electrode D of the NMOS transistor M, and Rsub represents an equivalent resistor of the P-type substrate.

Figure 8:
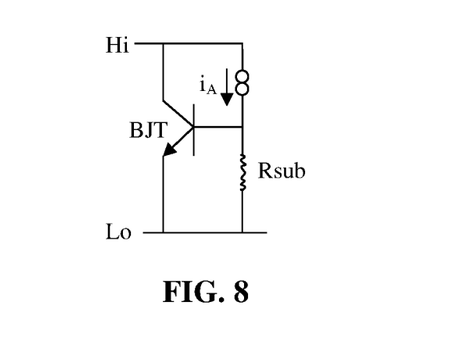
FIG. 8 is a first schematic diagram of an equivalent BJT of an electro-static protection structure according to an embodiment of the disclosure.
Figure 9:
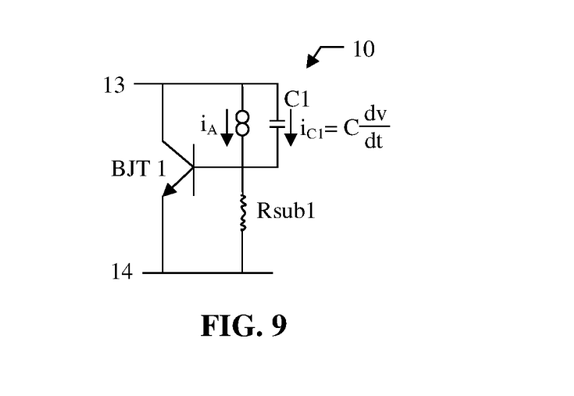
FIG. 9 is a second schematic diagram of an equivalent BJT of an electro-static protection structure according to an embodiment of the disclosure.

FIG. 8 is a schematic diagram of an equivalent BJT corresponding to the electro-static protection structure of FIG. 1, and FIG. 9 is a schematic diagram of an equivalent BJT corresponding to the electro-static protection structure of FIG. 5. When ESD occurs, an avalanche breakdown firstly occurs between the drain electrode D of the NMOS transistor M and the P-type substrate, and electrons and holes are generated. The holes enter the P-type substrate, so that the potential of the P-type substrate is raised. Finally, the parasitic BJT is turned on, and the ESD current is discharged. As illustrated in FIG. 8, the current generated by the holes is current $i_A$. However, in the electro-static protection structure, the trigger voltage is high, which is disadvantageous for ESD protection. As illustrated in FIG. 9, with the electro-static protection structure 10 provided by the embodiments of the disclosure, when ESD occurs, not only current $i_A$ generated due to the avalanche breakdown between the drain electrode of the NMOS transistor and the P-type substrate is present, but also a coupling current $i_{C1}$ generated at the first capacitor C1 due to the voltage change of the electro-static terminal. The magnitude of the coupling current $i_{C1}$ is:

$$i_{C1} = C \times \frac{dv}{dt},$$

where represents a capacitance value of the first capacitor C1, dv represents a voltage change amount at the electro-static terminal 13, and dt represents a time change amount. In this way, under the combined action of the current $i_A$ generated by the avalanche breakdown and the coupling current $i_{C1}$, the substrate potential can be raised higher and faster, the trigger voltage of the parasitic BJT 1 can be reduced, and the parasitic BJT 1 can be turned on faster, thereby discharging the ESD current to the ground to achieve a better electro-static protection effect.

When the electro-static protection is performed by the electro-static protection structure as illustrated in FIG. 5, in a case where ESD occurs, a coupling current is generated through the first capacitor C1 and injected into the P-type substrate 111 of the NMOS transistor 12a, so that the NPN-type parasitic BJT of the NMOS transistor 12a can be assisted to be rapidly turned on. It can be seen that the electro-static protection structure 10 not only has a low trigger voltage and a strong electro-static protection capability, but also has a high turn-on speed of the parasitic BJT 1, and also does not affect the normal function of the circuit, thus ensuring the normal operation of the circuit.

Figure 10:
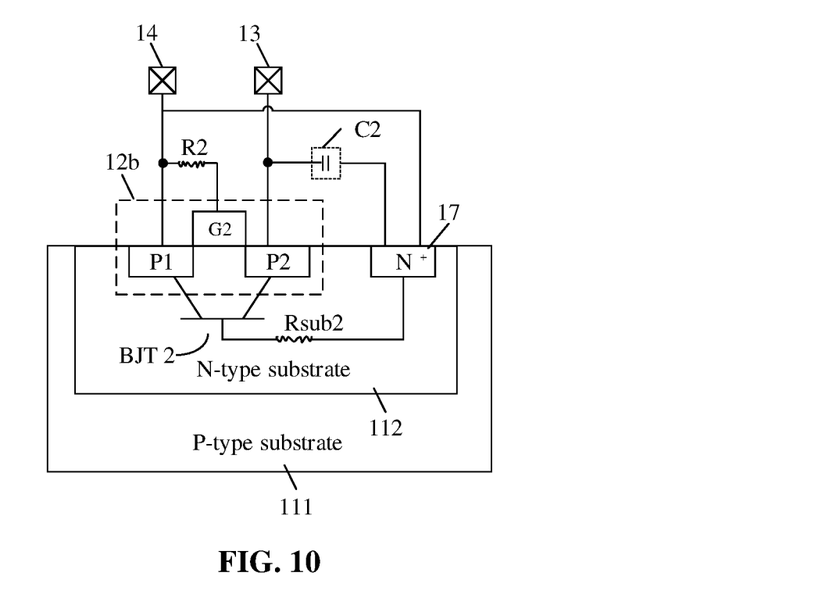
FIG. 10 is fourth a schematic diagram of a composition structure of an electro-static protection structure according to an embodiment of the disclosure.

In another specific implementation, as illustrated in FIG. 10, the substrate may be an N-type substrate (which may be represented by Nsub) 112, and the transistor may include a PMOS transistor 12b. First and second poles of the PMOS transistor 12b are a first P-type doped area P1 and a second P-type doped area P2, respectively, formed in the N-type substrate 112.

It is to be noted that in the embodiments of the disclosure, as illustrated in FIG. 10, the transistor may specifically be a PMOS transistor 12b. A first pole of the PMOS transistor 12b is a first P-type doped area P1, and a second pole of the PMOS transistor 12b is a second P-type doped area P2. The first P-type doped area P1 and the second P-type doped area P2 may be both heavily doped or both lightly doped, etc. and may be specifically set in combination with practical application scenarios. This is not specifically limited herein.

The first P-type doped area P1 may form a source electrode of the PMOS transistor 12b, and the second P-type doped area P2 may form a drain electrode of the PMOS transistor 12b.

As illustrated in FIG. 10, in some embodiments, the discharge terminal 14 is a power voltage terminal VDD, the N-type substrate 112 is connected with the power voltage terminal VDD, and an N+ doped area 17 is further formed in the N-type substrate 112. The second P-type doped area P2 is located between the first P-type doped area P1 and the N+ doped area 17. The first pole of the capacitor is connected with the N-type substrate 112 through the N+ doped area 17.

It is to be noted that in the specific example illustrated in FIG. 10, the capacitor may specifically be a second capacitor C2, and the second capacitor C2 is connected between the electro-static terminal 13 and the N+ doped area 17. The electro-static protection structure 10 serves to discharge a large amount of negative charge accumulated at the electro-static terminal 13 when ESD occurs, thereby preventing the ESD from damaging the device. In this case, the discharge terminal 14 is a power voltage terminal (VDD). The N-type substrate 112 is connected with the power voltage terminal (VDD).

It is also to be noted that in the embodiments of the disclosure, the N+ doped area 17 may be heavily doped to reduce parasitic resistance to facilitate the discharge of the ESD current. The connection mode between the N-type substrate 112 and the power voltage terminal VDD may be that: the N-type substrate 112 is connected with the power voltage terminal VDD through the N+ doped area 17, or the N-type substrate 112 is directly connected with the power voltage terminal VDD. This is not specifically limited herein.

It is also to be noted that a first pole of the second capacitor C2 is connected with the electro-static terminal 13, and a second pole of the second capacitor C2 is connected with the N+ doped area 17. That is, the second capacitor C2 may be connected with the N-type substrate 112 through the N+ doped area 17.

As illustrated in FIG. 10, a parasitic BJT 2 is formed in the N-type substrate 112, and the parasitic BJT 2 is of a PNP type. An emitter and collector of the parasitic BJT 2 are connected with the first P-type doped area and the second P-type doped area of the PMOS transistor 12b, respectively, and Rsub2 represents an equivalent resistor of the N-type substrate 112. When a large amount of negative charge is accumulated at the electro-static terminal 13 and the potential of the P-type substrate 111 is reduced sufficiently to turn on the PNP-type parasitic BJT 2, the parasitic BJT 2 is turned on, so that an ESD current generated by accumulating a large amount of negative charge at the electro-static terminal 13 can be discharged to the power voltage terminal VDD through the parasitic BJT 2.

Specifically, FIG. 10 illustrates a GGPMOS electro-static protection structure that is mainly used for discharging a large amount of negative charge accumulated at the electro-static terminal 13. When ESD occurs, after the parasitic BJT 2 is turned on, an ESD current generated at the electro-static terminal 13 enters the second P-type doped area P2, flows through the parasitic BJT 2 to reach the first N-type doped area P1, and is discharged to the power voltage terminal VDD.

In the embodiments of the disclosure, since the second capacitor C2 is connected between the electro-static terminal 13 and the N+ doped area, when ESD occurs due to the accumulation of negative charges in the electro-static terminal 13, on the one hand, an avalanche breakdown occurs between the PMOS transistor 12b and the N-type substrate 112 to generate electrons and holes, and the electrons enter the N-type substrate 112, so that the potential of the N-type substrate 112 is reduced, and on the other hand, due to the voltage change of the electro-static terminal 13, a coupling current is also generated at the capacitor 15 into the N-type substrate 112. Under the combined action of the electrons and the coupling current of the capacitor 15, the potential of the N-type substrate 112 is reduced faster and lower, so that the parasitic BJT 2 can be triggered and turned on faster and more sensitively, thereby discharging the ESD current, achieving a better leakage effect and better protecting the device.

Further, in some embodiments, as illustrated in FIG. 10, the electro-static protection structure 10 may also include a resistor R2. The resistor R2 is connected in series between a gate electrode G2 of the PMOS transistor 12b and the discharge terminal 14.

It is to be noted that a resistor R2 is also connected in series between the gate electrode G2 of the PMOS transistor 12b and the discharge terminal 14. The resistor R2 may also act as a gate electrode coupling to facilitate triggering of the parasitic BJT 2 when ESD occurs.

Further, as illustrated in FIG. 10, the N-type substrate 112 may be arranged in the P-type substrate 111.

It is to be noted that in the embodiments of the disclosure, when the substrate is the N-type substrate 112, the N-type substrate 112 may be arranged in the P-type substrate 111.

Figure 11:
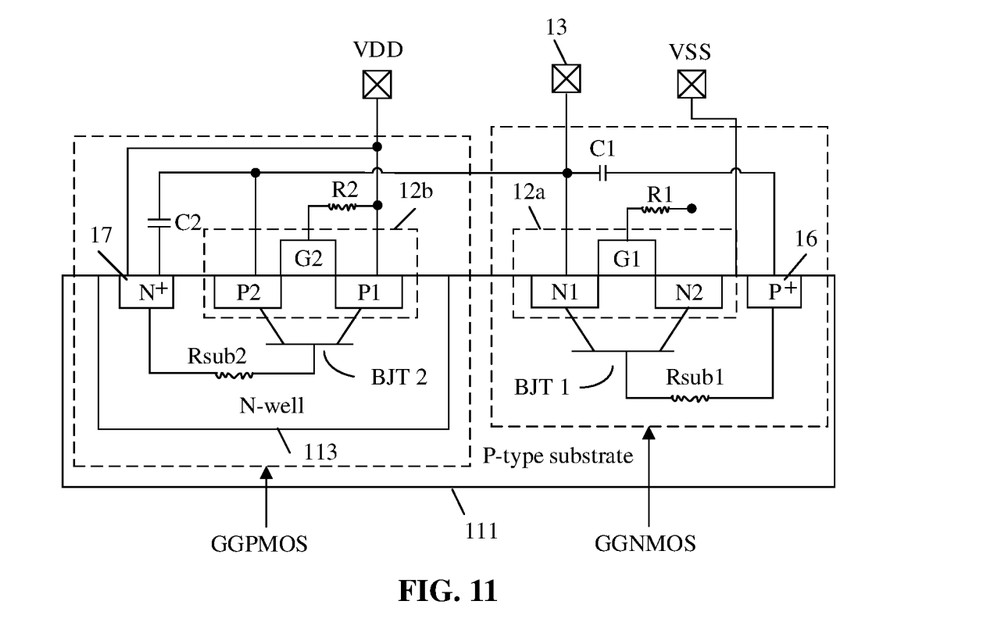
FIG. 11 is a fifth schematic diagram of a composition structure of an electro-static protection structure according to an embodiment of the disclosure.

In yet another specific embodiment, based on the electro-static protection structure 10 illustrated in FIG. 5, FIG. 11 illustrates a schematic diagram of a composition structure of another electro-static protection structure 10 according to an embodiment of the disclosure. As illustrated in FIG. 11, an N-well 113 is further formed in the P-type substrate 111, the transistor 12 may further include a PMOS transistor 12b. The PMOS transistor 12b is arranged in the N-well 113, a first pole and a gate electrode G2 of the PMOS transistor 12b are connected with a power voltage terminal VDD, and a second pole of the PMOS transistor 12b is connected with an electro-static terminal VSS.

A second capacitor C2 is included. A first pole of the second capacitor C2 is connected with the N-well 113, and a second pole of the second capacitor C2 is connected with the electro-static terminal 13.

It is to be noted that in the embodiments of the disclosure, as illustrated in FIG. 11, both an NMOS transistor 12a and a PMOS transistor 12b may be included in the electro-static protection structure 10. The NMOS transistor 12a is directly formed in the P-type substrate 111. Meanwhile, an N-well 113 is further formed in the P-type substrate 111, and the PMOS transistor 12b is formed in the N-well 113. Here, referring to FIG. 10, the N-well 113 corresponds to the N-type substrate 112 in FIG. 10.

It is also to be noted that the electro-static protection structure illustrated in FIG. 11 includes both the GGNMOS electro-static protection structure illustrated in FIG. 5 and the GGPMOS electro-static protection structure illustrated in FIG. 10. At this time, the ESD terminal 14 includes a ground terminal VSS and a power voltage terminal VDD. That is, when a large amount of positive charge is accumulated at the electro-static terminal 13, the ESD current generated by accumulating the large amount of positive charge may be discharged to the ground terminal VSS through the GGNMOS. When a large amount of negative charge is accumulated at the electro-static terminal 13, an ESD current generated by accumulating the large amount of negative charge may be discharged to the power voltage terminal VDD through the GGPMOS. In this way, electro-static protection of the device can be achieved in a variety of different application scenarios.

In some embodiments, as illustrated in FIG. 11, the first and second poles of the PMOS transistor 12b are first and second P-type doped areas P1 and P2, respectively, formed in the N-well 113, an N+ doped area 17 is further formed in the N-well 113, and the second P-type doped area P2 is located between the first P-type doped area P1 and the N+ doped area 17.

In some embodiments, as illustrated in FIG. 11, the first pole of the second capacitor C2 is connected with the N-well 113 through the N+ doped area 17.

In some embodiments, as illustrated in FIG. 11, the N-well 113 is connected with the power voltage terminal VDD.

It is to be noted that in the electro-static protection structure 10 illustrated in FIG. 11, the N+ doped area 17, the second P-type doped area P2, the first N-type doped area N1, and the P+ doped area 16 are all connected with the electro-static terminal 13, the N+ doped area 17 may be connected with the electro-static terminal 13 through the second capacitor C2, and the P+ doped area 16 may be connected with the electro-static terminal 13 through the first capacitor C1.

The P-type substrate 111, the gate electrode G1 of the NMOS transistor N1 and the second N-type doped area N2 are all connected with the ground terminal VSS, and the gate electrode G1 of the NMOS transistor 12a may be connected with the ground terminal VSS through the first resistor R1. The P-type substrate 111 may be directly connected with the ground terminal VSS or may be connected with the ground terminal VSS through the P+ doped area 16.

The N-well 113, the N+ doped area 17, the gate electrode G2 of the PMOS transistor 12b, and the first P-type doped area P1 are all connected with the power voltage terminal VDD, and the gate electrode G2 of the PMOS transistor 12b may be connected with the power voltage terminal VDD through the second resistor R2. The N-well 113 may be directly connected with the power voltage terminal VDD or may be connected with the power voltage terminal VDD through the N+ doped area 17.

In the P-type substrate 111, an NPN-type parasitic BJT 1 is formed, and the parasitic BJT 1 is formed between the first and second poles of the NMOS transistor 12a. Rsub1 represents a parasitic resistor of the P-type substrate 111. When a large amount of positive charge is accumulated at the electro-static terminal 13 and ESD occurs, under the combined action of current generated by the avalanche breakdown and the coupling current of the first capacitor C1, the potential of the P-type substrate 111 will be raised higher and faster, thereby rapidly turning on the parasitic BJT 1, and discharging the ESD current to the ground terminal VSS through the parasitic BJT 1.

In the N-well 113, a PNP-type parasitic BJT 2 is formed, and the parasitic BJT 2 is formed between the first and second poles of the PMOS transistor 12b. Rsub2 represents a parasitic resistor of the N-well 113. When a large amount of negative charge is accumulated at the electro-static terminal 13 and ESD occurs, under the combined action of current generated by the avalanche breakdown and the coupling current at the capacitor C2, the potential of the N-well will be reduced faster and in a large amplitude, thereby rapidly turning on the parasitic BJT 2, and discharging the ESD current to the power voltage terminal VDD through the parasitic BJT 2.

In this way, the electro-static protection structure 10 provided by the embodiments of the disclosure can reduce the trigger voltage and achieve fast turn-on of the parasitic BJT for the purpose of electro-static protection.

Embodiments of the disclosure provide an electro-static protection structure. The electro-static protection structure includes a substrate, a transistor formed in the substrate, and a capacitor. A first pole of the transistor is connected with an electro-static terminal, and a second pole of the transistor and a gate electrode of the transistor are connected with a discharge terminal. A first pole of the capacitor is connected with the substrate, and a second pole of the capacitor is connected with the electro-static terminal. In this way, when ESD occurs, an avalanche breakdown occurs between the transistor and the substrate to generate current into the substrate, and a coupling current will also be generated into the substrate at the capacitor, so that the potential of the substrate changes in a larger amplitude and a faster speed. Thus, a parasitic BJT in the electro-static protection structure can be quickly turned on to discharge an ESD current, so as to play a good electro-static protection function and avoid damaging the device.

Figure 12:
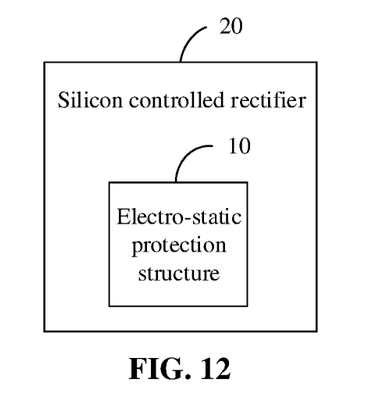
FIG. 12 is a schematic diagram of a composition structure of an SCR according to an embodiment of the disclosure.

In another embodiment of the disclosure, FIG. 12 illustrates a schematic diagram of a composition structure of an SCR 20 according to an embodiment of the disclosure. As illustrated in FIG. 12, the SCR 20 includes the electro-static protection structure 10 according to any of the foregoing embodiments.

It should be noted that the ESD mode for rapidly turning on a parasitic BJT by increasing a coupling current through a capacitor may also be applied to a substrate-triggered electro-static protection device such as an SCR. With regard to the SCR 20, since the SCR includes the electro-static protection structure 10 according to the preceding embodiment, when ESD occurs, the electric potential of the substrate changes in a larger amplitude and a faster speed. Thus, a parasitic BJT in the electro-static protection structure can be quickly turned on to discharge an ESD current, so as to play a good electro-static protection function, achieve the purpose of electro-static protection and avoid damaging the device.

Figure 13:
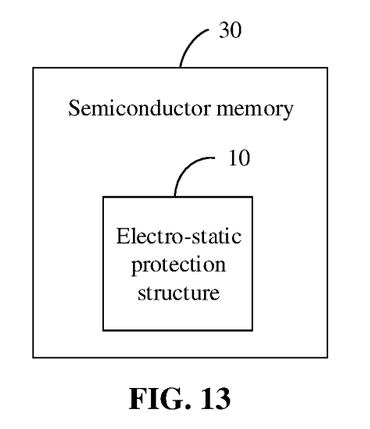
FIG. 13 is a schematic diagram of a composition structure of a semiconductor memory according to an embodiment of the disclosure.

In yet another embodiment of the disclosure, FIG. 13 illustrates a schematic diagram of a composition structure of a semiconductor memory 30 according to an embodiment of the disclosure. As illustrated in FIG. 13, the semiconductor memory 30 includes the electro-static protection structure 10 according to any of the foregoing embodiments.

It is to be noted that the electro-static protection structure may be applied to various types of semiconductor integrated circuits, such as electro-static protection of logic circuits, analog circuits, and various types of memory chips. The semiconductor memory 30 may be a Dynamic Random Access Memory (DRAM), a Static Random-Access Memory (SRAM), etc. With regard to the semiconductor memory 30, since the SCR includes the electro-static protection structure 10 according to the preceding embodiment, when ESD occurs, the electric potential of the substrate changes in a larger amplitude and a faster speed. Thus, a parasitic BJT in the electro-static protection structure can be quickly turned on to discharge an ESD current, so as to play a good electro-static protection function, achieve the purpose of electro-static protection and avoid damaging the device.

The foregoing is only a preferred embodiment of the disclosure and is not intended to limit the scope of protection of the disclosure.

It is to be noted that the terms "including", "containing" or any other variations thereof are intended to cover a non-exclusive inclusion in the disclosure, such that a process, method, article, or apparatus including a series of elements not only includes those elements, but also includes other elements that are not explicitly listed, or also includes elements inherent to such process, method, article, or apparatus. It is not excluded, without more constraints, that additional identical elements exist in the process, method, article, or apparatus including elements defined by a sentence "including a . . . ".

The sequence numbers of the embodiments of the disclosure are adopted not to represent superiority-inferiority of the embodiments but only for description.

The methods disclosed in the several method embodiments provided by the disclosure may be combined arbitrarily without conflict to obtain a new method embodiment.

The features disclosed in the several product embodiments provided by the disclosure may be combined arbitrarily without conflict to obtain a new product embodiment.

The features disclosed in the several method or device embodiments provided by the disclosure may be combined arbitrarily without conflict to obtain a new method or device embodiment.

The above description is only the specific implementation mode of the disclosure and not intended to limit the scope of protection of the disclosure. Any variations or replacements apparent to those skilled in the art within the technical scope disclosed by the disclosure should fall within the scope of protection of the disclosure. Therefore, the scope of protection of the disclosure should be determined by the scope of protection of the claims.

Embodiments of the disclosure provide an electro-static protection structure, an SCR and a semiconductor memory. The electro-static protection structure includes a substrate, a transistor formed in the substrate, and a capacitor. A first pole of the transistor is connected with an electro-static terminal, and a second pole of the transistor and a gate electrode of the transistor are connected with a discharge terminal. A first pole of the capacitor is connected with the substrate, and a second pole of the capacitor is connected with the electro-static terminal. In this way, when ESD occurs, an avalanche breakdown occurs between the transistor and the substrate to generate current into the substrate, and a coupling current will also be generated into the substrate at the capacitor, so that the potential of the substrate changes in a larger amplitude and a faster speed. Thus, a parasitic BJT in the electro-static protection structure can be quickly turned on to discharge an ESD current, so as to play a good electro-static protection function and avoid damaging the device.

What is claimed is:

1. An electro-static protection structure, comprising:
    a substrate;
    a transistor formed in the substrate, a first pole of the transistor being connected with an electro-static terminal, and a second pole of the transistor and a gate electrode of the transistor being both connected with a discharge terminal;
    wherein the transistor comprises an N-type channel Metal Oxide Semiconductor (NMOS) transistor or a P-type channel Metal Oxide Semiconductor (PMOS) transistor or both; and a capacitor, a first pole of the capacitor being connected with the substrate, and a second pole of the capacitor being connected with the electro-static terminal;

wherein the NMOS transistor comprises a P-type substrate, and a first pole and a second pole of the NMOS transistor are respectively a first N-type doped area and a second N-type doped area formed in the P-type substrate; and the capacitor comprises a first capacitor, a first pole of the first capacitor is connected with the P-type substrate, and a second pole of the first capacitor is connected with the electro-static terminal;

the electro-static protection structure further comprising a resistor, wherein the resistor is connected in series between a gate electrode of the NMOS transistor and the discharge terminal.

2. The electro-static protection structure according to claim 1, wherein a P+ doped area is further formed in the P-type substrate; and the second N-type doped area is located between the first N-type doped area and the P+ doped area.

3. The electro-static protection structure according to claim 2, wherein the first pole of the first capacitor is connected with the P-type substrate through the P+ doped area.

4. The electro-static protection structure according to claim 1, wherein the discharge terminal is a ground terminal, and the P-type substrate is connected with the ground terminal.

5. The electro-static protection structure according to claim 1, wherein the PMOS transistor comprises an N-type substrate, and a first pole and a second pole of the PMOS transistor are respectively a first P-type doped area and a second P-type doped area formed in the N-type substrate.

6. The electro-static protection structure according to claim 5, wherein an N+ doped area is further formed in the N-type substrate; and the second P-type doped area is located between the first P-type doped area and the N+ doped area.

7. The electro-static protection structure according to claim 6, wherein the first pole of the capacitor is connected with the N-type substrate through the N+ doped area.

8. The electro-static protection structure according to claim 5, wherein the discharge terminal is a power voltage terminal, and the N-type substrate is connected with the power voltage terminal.

9. The electro-static protection structure according to claim 5, wherein the N-type substrate is arranged in the P-type substrate.

10. The electro-static protection structure according to claim 1, wherein an N-well is further formed in the P-type substrate, the PMOS transistor is arranged in the N-well, a first pole and a gate electrode of the PMOS transistor are connected with a power voltage terminal, and a second pole of the PMOS transistor is connected with the electro-static terminal; and a second capacitor is further comprised, a first pole of the second capacitor is connected with the N-well, and a second pole of the second capacitor is connected with the electro-static terminal.

11. The electro-static protection structure according to claim 10, wherein a first pole and a second pole of the PMOS transistor are respectively a first P-type doped area and a second P-type doped area formed in the N-well, an N+ doped area is further formed in the N-well, and the second P-type doped area is located between the first P-type doped area and the N+ doped area.

12. The electro-static protection structure according to claim 11, wherein the first pole of the second capacitor is connected with the N-well through the N+ doped area.

13. The electro-static protection structure according to claim 10, wherein the N-well is connected with the power voltage terminal.

14. A Silicon Controlled Rectifier (SCR), comprising an electro-static protection structure, wherein the electro-static protection structure comprises:

a substrate;

a transistor formed in the substrate, a first pole of the transistor being connected with an electro-static terminal, and a second pole of the transistor and a gate electrode of the transistor being both connected with a discharge terminal;

wherein the transistor comprises an N-type channel Metal Oxide Semiconductor (NMOS) transistor or a P-type channel Metal Oxide Semiconductor (PMOS) transistor or both; and a capacitor, a first pole of the capacitor being connected with the substrate, and a second pole of the capacitor being connected with the electro-static terminal;

wherein the NMOS transistor comprises a P-type substrate, and a first pole and a second pole of the NMOS transistor are respectively a first N-type doped area and a second N-type doped area formed in the P-type substrate; and the capacitor comprises a first capacitor, a first pole of the first capacitor is connected with the P-type substrate, and a second pole of the first capacitor is connected with the electro-static terminal;

the electro-static protection structure further comprising a resistor, wherein the resistor is connected in series between a gate electrode of the NMOS transistor and the discharge terminal.

15. The SCR according to claim 14, wherein a P+ doped area is further formed in the P-type substrate; and the second N-type doped area is located between the first N-type doped area and the P+ doped area.

16. The SCR according to claim 15, wherein the first pole of the first capacitor is connected with the P-type substrate through the P+ doped area.

17. A semiconductor memory, comprising an electro-static protection structure, wherein the electro-static protection structure comprises:

a substrate;

a transistor formed in the substrate, a first pole of the transistor being connected with an electro-static terminal, and a second pole of the transistor and a gate electrode of the transistor being both connected with a discharge terminal;

wherein the transistor comprises an N-type channel Metal Oxide Semiconductor (NMOS) transistor or a P-type channel Metal Oxide Semiconductor (PMOS) transistor or both; and a capacitor, a first pole of the capacitor being connected with the substrate, and a second pole of the capacitor being connected with the electro-static terminal;

wherein the NMOS transistor comprises a P-type substrate, and the first pole and the second pole of the NMOS transistor are respectively a first N-type doped area and a second N-type doped area formed in the P-type substrate; and the capacitor comprises a first capacitor, a first pole of the first capacitor is connected with the P-type substrate, and a second pole of the first capacitor is connected with the electro-static terminal;

the electro-static protection structure further comprising a resistor, wherein the resistor is connected in series between a gate electrode of the NMOS transistor and the discharge terminal.

\* \* \* \* \*